US012575361B2

(12) United States Patent
Kim

(10) Patent No.: US 12,575,361 B2
(45) Date of Patent: Mar. 10, 2026

(54) METHOD OF ETCHING THIN FILM AND SUBSTRATE PROCESSING APPARATUS

(71) Applicant: SEMES CO., LTD.,
Chungcheongnam-do (KR)

(72) Inventor: Won-Geun Kim, Gyeonggi-do (KR)

(73) Assignee: SEMES CO., LTD.,
Chungcheongnam-Do (KR)

( * ) Notice: Subject to any disclaimer, the term of this patent is extended or adjusted under 35 U.S.C. 154(b) by 377 days.

(21) Appl. No.: 18/192,820

(22) Filed: Mar. 30, 2023

(65) Prior Publication Data

US 2023/0377911 A1 Nov. 23, 2023

(30) Foreign Application Priority Data

May 19, 2022 (KR) ........................ 10-2022-0061552

(51) Int. Cl.
*H10P 72/00* (2026.01)
*H10P 72/76* (2026.01)
(52) U.S. Cl.
CPC ...... *H10P 72/0424* (2026.01); *H10P 72/0436* (2026.01); *H10P 72/7626* (2026.01)
(58) Field of Classification Search
CPC ........... H01L 21/32134; H01L 21/6708; H10P 50/642
See application file for complete search history.

(56) References Cited

U.S. PATENT DOCUMENTS

| | | | |
|---|---|---|---|
| 11,495,467 B2 | 11/2022 | Goh et al. | |
| 2008/0176407 A1* | 7/2008 | Nagakura | ......... H01L 21/67028 |
| | | | 257/E21.249 |
| 2012/0015523 A1 | 1/2012 | Leonhard et al. | |
| 2014/0231012 A1 | 8/2014 | Hinode et al. | |

(Continued)

FOREIGN PATENT DOCUMENTS

| | | |
|---|---|---|
| JP | 6242056 B2 | 12/2017 |
| JP | 2020-194946 A | 12/2020 |

(Continued)

OTHER PUBLICATIONS

Korean Office Action issued in corresponding KR Patent Application No. 10-2022-0061552, dated Nov. 28, 2024, pp. 1-5.

(Continued)

*Primary Examiner* — Thomas T Pham
(74) *Attorney, Agent, or Firm* — Carter, DeLuca & Farrell LLP

(57) ABSTRACT

A method of etching a thin film includes: a first puddling operation of forming a first puddle of a chemical solution on a substrate by supplying and spreading the chemical solution on the substrate on which a thin film is formed; a first etching operation of partially etching the thin film using the chemical solution on the substrate; a first rinsing operation of supplying the chemical solution onto the substrate to rinse off the first puddle of the chemical solution and apply the chemical solution onto the substrate; a second puddling operation of forming a second puddle of the chemical solution on the substrate; a second etching operation of (Continued)

partially etching the thin film; and a second rinsing operation of supplying the chemical solution onto the substrate to rinse off the second puddle of the chemical solution on the substrate and apply the chemical solution on to the substrate.

13 Claims, 8 Drawing Sheets

(56)                    References Cited

U.S. PATENT DOCUMENTS

| | | | |
|---|---|---|---|
| 2016/0049308 | A1 | 2/2016 | Hinode et al. |
| 2018/0233383 | A1* | 8/2018 | Ashidate ........... H01L 21/31111 |
| 2021/0178522 | A1 | 6/2021 | Kim et al. |
| 2022/0084847 | A1 | 3/2022 | Lee |

FOREIGN PATENT DOCUMENTS

| | | |
|---|---|---|
| KR | 10-2012-0007991 A | 1/2012 |
| KR | 10-2016-0021036 A | 2/2016 |
| KR | 10-2021-0075562 A | 6/2021 |
| KR | 10-2326012 B1 | 11/2021 |
| KR | 10-2022-0035734 A | 3/2022 |

OTHER PUBLICATIONS

Korean Office Action issued in corresponding KR Patent Application No. 10-2022-0061552, dated Mar. 26, 2024, pp. 1-4.

* cited by examiner

FIG. 6

| OPERATION | DETAILED OPERATION | HEATING SUBSTRATE | SUPPLY OF CHEMICAL SOLUTION | ROTATION OF SUBSTRATE (RPM) | time [s] |
|---|---|---|---|---|---|
| 1st Puddling (S10) | FIRST WETTING(S12) | - | $H_3PO_4$ SOLUTION | $\leq 15$ | $\leq 10$ |
| | FIRST PUDDLE FORMATION (S14) | - | - | $\leq 15$ | $\leq 10$ |
| | FIRST LIQUID LAYER STABILIZATION (S16) | - | - | $4 \leq T/G \leq 6$ | $\leq 10$ |
| 1st Etching (S20) | FIRST ETCHING (S20) | MAINTAIN AFTER RAISING TEMPERATURE | - | $4 \leq T/G \leq 6$ | $\leq 120$ |
| 1st Rinse (S30) | FIRST RINSE (S30) | - | $H_3PO_4$ SOLUTION | $100 \leq$ | $\leq 20$ |
| 2nd Puddling (S40) | SECOND WETTING AND PUDDLE FORMATION (S44) | - | $H_3PO_4$ SOLUTION | $4 \leq T/G \leq 6$ | $\leq 5$ |
| | SECOND LIQUID LAYER STABILIZATION (S46) | - | - | $4 \leq T/G \leq 6$ | $\leq 10$ |
| 2nd Etching (S50) | SECOND ETCHING (S50) | MAINTAIN AFTER RAISING TEMPERATURE | - | $4 \leq T/G \leq 6$ | $\leq 120$ |
| 2nd Rinse (S60) | SECOND RINSE (S60) | - | $H_3PO_4$ SOLUTION | $100 \leq$ | $\leq 20$ |
| ... | ... | | ... | ... | ... |

FIG. 7

| MEASURED VALUE | | FIRST CYCLE | SECOND CYCLE | THIRD CYCLE |
|---|---|---|---|---|
| ETCHED THICKNESS (Å) | | 399 | 273 | 303 |
| RATE OF CHANGE (%) | | N/A | −31 | +10 |
| DISTRIBUTION (%) | Xscan | 8.1 | 13.4 | 13.6 |
| | Polar | 15.4 | 26.7 | 28.7 |
| ETCHING MAP | | | | |

METHOD OF ETCHING THIN FILM AND SUBSTRATE PROCESSING APPARATUS

CROSS-REFERENCE TO RELATED APPLICATION(S)

This application claims the benefit under 35 USC § 119(a) of Korean Patent Application No. 10-2022-0061552, filed on May 19, 2022, in the Korean Intellectual Property Office, the entire disclosure of which is incorporated herein by reference for all purposes.

BACKGROUND

1. Field

The following description relates to semiconductor manufacturing, and more particularly, to a method of etching a thin film and a substrate processing apparatus.

2. Description of Related Art

To fabricate a semiconductor devices, various processes such as photolithography, etching, ashing, ion implantation, deposition, cleaning, and the like are performed on a substrate, and various substrate processing apparatuses are used for this purpose. Among these processes, an etching process may be used to etch a thin film on a substrate. For example, wet etching with a chemical solution may be used to isotropically etch a thin film not only in a vertical direction but also in a horizontal direction.

A cyclic wet etching which is performed while a chemical solution is periodically supplied onto a substrate is advantageous in that the amount of chemical liquid used can be reduced. In such a cyclic wet etching process, the temperature and molar concentration of a chemical solution may have significant influence on an etch rate. Generally, for uniform etching, deionized water (DI) rinsing and drying processes are performed as bridge stages between cycles.

However, the addition of the deionized water (DI water) rinse and drying processes may greatly increase the overall process time. Furthermore, a gas-blowing process may be added to dry a substrate after the deionized water rinsing process. As a result, the processes may be complicated and process time is lengthened, thereby reducing the efficiency of production.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a method of etching a thin film and a substrate processing apparatus, which can increase the efficiency of production by reducing process time. However, the object is merely illustrative, and the scope of the present invention is not limited thereto.

In one general aspect, a method of etching a thin film may include: a first puddling operation of forming a first puddle of a chemical solution on a substrate by supplying and spreading the chemical solution on the substrate on which a thin film is formed; a first etching operation of partially etching the thin film using the chemical solution on the substrate; a first rinsing operation of supplying the chemical solution onto the substrate to rinse off the first puddle of the chemical solution on the substrate and apply the chemical solution onto the substrate; a second puddling operation of forming a second puddle of the chemical solution on the substrate by supplying and spreading the chemical solution on the substrate; a second etching operation of partially etching the thin film using the chemical solution on the substrate; and a second rinsing operation of supplying the chemical solution onto the substrate to rinse off the second puddle of the chemical solution on the substrate and apply the chemical solution onto the substrate.

According to the method of etching a thin film, a rotation speed of the substrate in the first rinsing operation and the second rinsing operation may be greater than a rotation speed of the substrate in the first puddling operation and the second puddling operation.

According to the method of etching a thin film, a rotation speed of the substrate in the first rinsing operation and the second rinsing operation may be greater than a rotation speed of the substrate in the first etching operation and the second etching operation.

According to the method of etching a thin film, the first puddling operation may include a first wetting operation of rotating the substrate while dispensing the chemical solution onto the substrate, a first puddle forming operation of stopping the dispensing of the chemical solution and forming the first puddle of the chemical solution while rotating the substrate, and a first liquid layer stabilizing operation of stabilizing a thickness of an liquid layer of the chemical solution on the substrate.

According to the method of etching a thin film, a rotation speed of the substrate in the first liquid layer stabilizing operation may be less than a rotation speed of the substrate in the first wetting operation and the first puddling forming operation.

According to the method of etching a thin film, the second puddling operation may include a second puddle forming operation of wetting the chemical solution and forming the second puddle of the chemical solution by rotating the substrate while further dispensing the chemical solution onto the substrate, and a second liquid layer stabilizing operation of stabilizing a thickness of the liquid layer of the chemical solution on the substrate.

According to the method of etching a thin film, a rotation speed of the substrate in the second puddling forming operation may be less than a rotation speed of the substrate in the first wetting operation and the first puddling forming operation.

According to the method of etching a thin film, a rotation speed of the substrate may be the same in the second puddle forming operation, the second liquid layer stabilizing operation, and the second etching operation.

According to the method of etching a thin film, a total process time of the second puddling operation may be shorter than a total process time of the first puddling operation.

According to the method of etching a thin film, the substrate may be rapidly heated and maintained at a predetermined temperature in the first etching operation and the second etching operation.

According to the method of etching a thin film, the substrate may be rapidly heated through irradiation with laser from below the substrate.

According to the method of etching a thin film, the second puddling operation, the second etching operation, and the second rinsing operation may be repeated a plurality of times.

According to the method of etching a thin film, the thin film may include a nitride film and the chemical solution may include a phosphoric acid aqueous solution.

In another general aspect, a method of etching a thin film may include: a first puddling operation of forming a first puddle of a chemical solution on a substrate by supplying and spreading the chemical solution on the substrate on which a thin film is formed; a first etching operation of partially etching the thin film using the chemical solution on the substrate; a first rinsing operation of supplying the chemical solution onto the substrate to rinse off the chemical solution on the substrate and apply the chemical solution onto the substrate; a second puddling operation of forming a second puddle of the chemical solution on the substrate by supplying and spreading the chemical solution on the substrate; a second etching operation of partially etching the thin film using the chemical solution on the substrate; and a second rinsing operation of supplying the chemical solution onto the substrate to rinse off the second puddle of the chemical solution on the substrate and apply the chemical solution on to the substrate, wherein: the first puddling operation may include a first wetting operation of rotating the substrate while dispensing the chemical solution onto the substrate, a first puddle forming operation of stopping the dispensing of the chemical solution and forming the first puddle of the chemical solution while rotating the substrate, and a first liquid layer stabilizing operation of stabilizing a thickness of an liquid layer of the chemical solution on the substrate; the second puddling operation may include a second puddle forming operation of wetting the chemical solution and forming the second puddle of the chemical solution by rotating the substrate while further dispensing the chemical solution onto the substrate and a second liquid layer stabilizing operation of stabilizing a thickness of an liquid layer of the chemical solution on the substrate; and wherein a rotation speed of the substrate in the first rinsing operation and the second rinsing operation may be greater than a rotation speed of the substrate in the first puddling operation and the second puddling operation.

In still another general aspect, a substrate processing apparatus may include: a processing container having an inner space; a substrate support unit installed in the processing container to support and rotate a substrate on which a thin film is formed; a chemical solution dispensing unit disposed on the substrate support unit to dispense a chemical solution onto the substrate; and a control unit configured to control rotation of the substrate support unit and dispensing of the chemical solution by the chemical solution dispensing unit, wherein, in order to etch the thin film, the control unit may control the substrate support unit and the chemical solution dispensing unit to repeatedly perform a puddling operation of forming a puddle of the chemical solution by supplying the chemical solution onto the substrate, an etching operation of partially etching the thin film using the chemical solution on the substrate, and a rinsing operation of supplying the chemical solution onto the substrate to apply the chemical solution onto the substrate while rinsing off the puddle of the chemical solution on the substrate, twice or more in this order.

According to the substrate processing apparatus, the control unit may control the rotation of the substrate support unit such that a rotation speed of the substrate in the rinsing operation is greater than a rotation speed of the substrate in the puddling operation.

According to the substrate processing apparatus, the control unit may control the rotation of the substrate support unit such that a rotation speed of the substrate in the rinsing operation is greater than a rotation speed of the substrate in the etching operation.

According to the substrate processing apparatus, the control unit may control temperature of the substrate such that the substrate is rapidly heated and maintained at a predetermined temperature in the etching operation.

The substrate processing apparatus may further include a laser emitting unit configured to emit laser to the substrate from below the substrate, wherein the control unit may control the laser emitting unit to emit laser from below the substrate in order to rapidly heat the substrate in the etching operation.

According to the substrate processing apparatus, the substrate support unit may include a seat and a shaft, the laser emitting unit may be at least in part disposed in the shaft, and the seat may be formed of a light transmitting material so that the laser emitted from the laser emitting unit passes through the seat.

Other features and aspects will be apparent from the following detailed description, the drawings, and the claims.

BRIEF DESCRIPTION OF THE DRAWINGS

FIG. 6 is a table illustrating details of each process operation in a method of etching a thin film according to exemplary embodiments of the present invention.

FIG. 7 is a table illustrating results of etching a thin film according an experimental example of the present invention.

Figure 1:
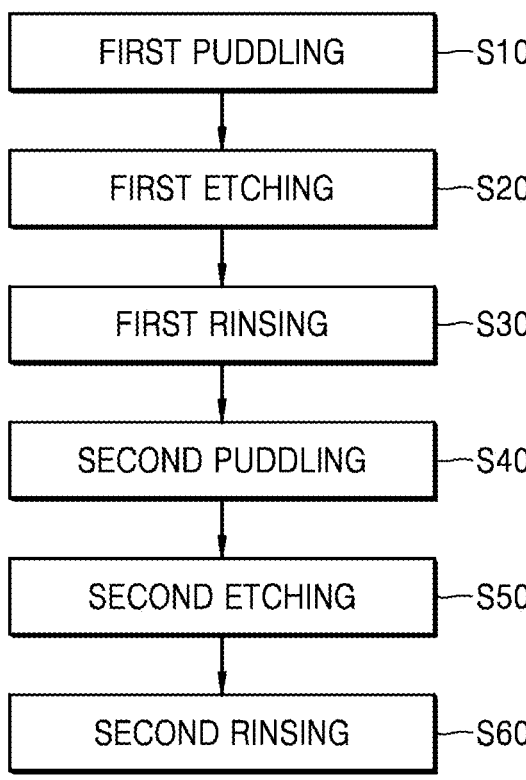
FIG. 1 is a schematic flowchart illustrating a method of etching a thin film according to an exemplary embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, various preferred embodiments of the present invention will be described in detail with reference to the accompanying drawings.

The embodiments of the present invention are provided for more fully describing the present invention to those skilled in the art, and the embodiments below may be modified in various forms, and the scope of the present invention is not limited to the embodiments below. Rather, these embodiments are provided such that this disclosure will be thorough and complete and will fully convey the spirit of the present invention to those skilled in the art. Also, thickness or sizes of layers in the drawings are exaggerated for convenience of explanation and clarity.

Hereinafter, the embodiments of the present invention are described in detail with reference to the accompanying drawings. In the drawings, the illustrated shapes may be modified according to, for example, manufacturing technology and/or tolerance. Thus, the embodiment of the present invention may not be construed to be limited to a particular shape of a part described in the present specification and may include a change in the shape generated during manufacturing, for example.

Figure 2:
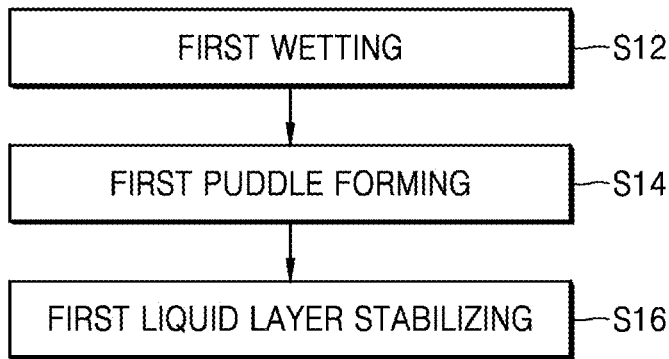
FIG. 2 is a schematic flowchart illustrating an example of a first puddling operation in the method of etching a thin film shown in FIG. 1.
Figure 3:
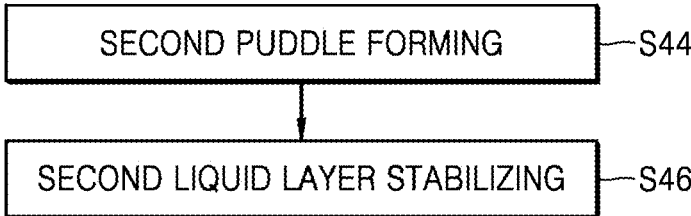
FIG. 3 is a schematic flowchart illustrating an example of a second puddling operation in the method of etching a thin film shown in FIG. 1.

FIG. 1 is a schematic flowchart illustrating a method of etching a thin film according to an exemplary embodiment of the present invention, FIG. 2 is a schematic flow chart showing an example of a first puddling operation in the thin film etching method shown in FIG. 1, and FIG. 3 is a schematic flowchart illustrating an example of a second puddling operation in the method of etching a thin film shown in FIG. 1.

Referring to FIG. 1, a method of etching a thin film according to an exemplary embodiment of the present invention may include a first puddling operation S10, a first etching operation S20, a first rinsing operation S30, a second puddling operation S40, a second etching operation S50, and a second rinsing operation S60.

Figure 9:
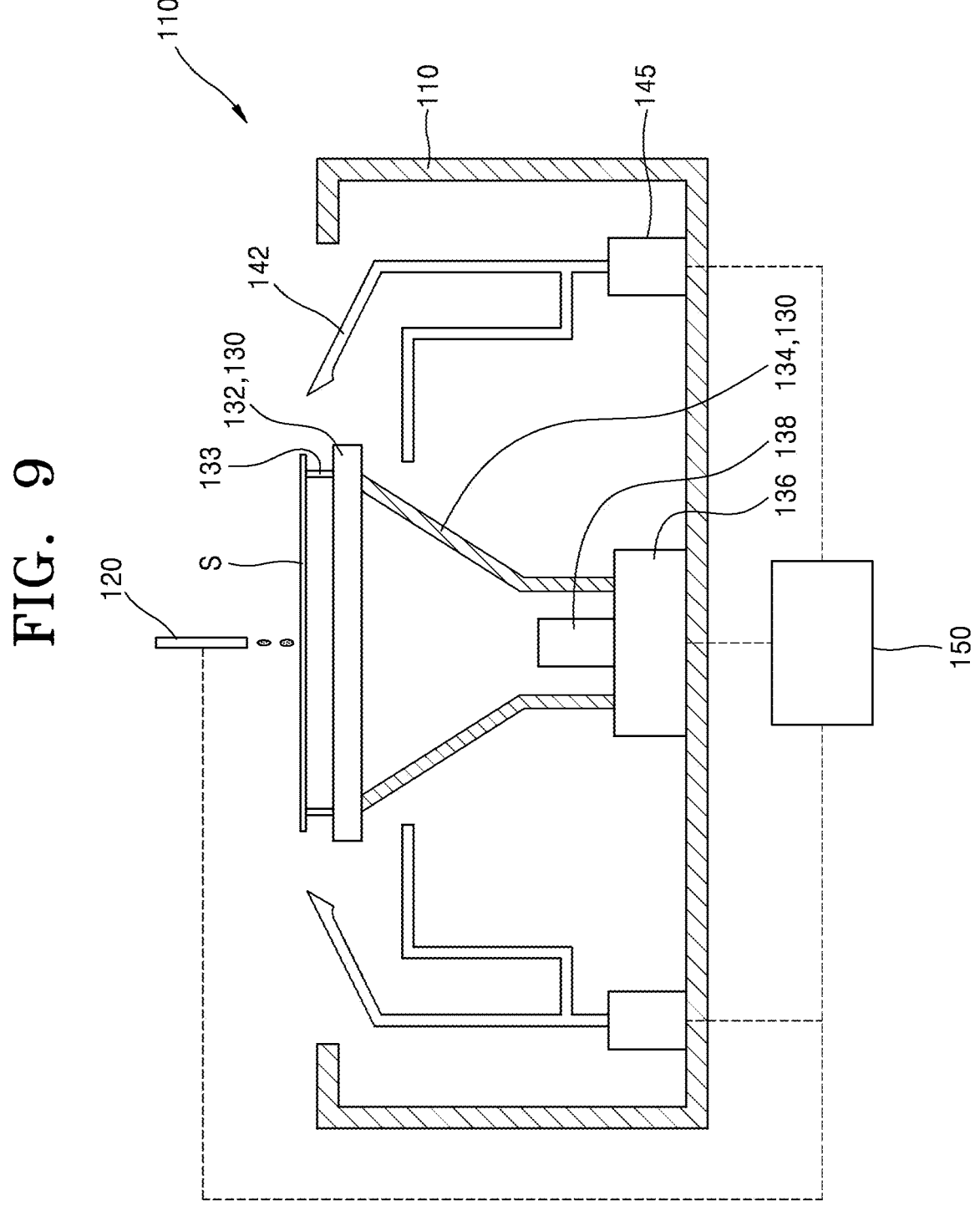
FIG. 9 is a schematic cross-sectional view showing a substrate processing apparatus for etching a thin film according to exemplary embodiments of the present invention.

More specifically, in the first puddling operation S10, a first puddle of a chemical solution may be formed on a substrate (S in FIG. 9). For example, the chemical solution may be supplied and spread on the substrate S, on which a thin film is formed, to form a first puddle of the chemical solution. The first puddle of the chemical solution may remain on the substrate S for a predetermined period of time, allowing the chemical solution to be supplied to the thin film.

In the first puddling operation S10, the chemical solution may be uniformly spread on the substrate S and may not overflow out of the edge of the substrate S due to its surface tension with the substrate S. For example, the chemical solution may be dispensed onto the substrate S and the substrate S may be rotated so that the chemical solution is spread on the substrate S and the first puddle of the chemical solution is formed. In the first puddling operation S10, it is necessary to control the substrate S to rotate at a predetermined speed or less to prevent the chemical solution from escaping from the substrate S.

In the first etching operation S20, the thin film may be partially etched using the chemical solution on the substrate S. For example, in operation S50, the chemical solution may react with the thin film, thereby etching the thin film. In some exemplary embodiment, in operation S20, the etching may be performed while the substrate S is rotated at low speed to prevent the chemical liquid from escaping from the substrate S. An etch rate may decrease over time since the chemical solution forming the puddle on the substrate S is supplied in a limited quantity. Therefore, the first etching operation S20 may be performed for a predetermined period of time.

In some exemplary embodiments, the thin film may include a nitride film, and the chemical solution may include a phosphoric acid aqueous solution, for example, a $H_3PO_4$ aqueous solution, for etching the nitride film. In some other exemplary embodiments, a stacked structure of nitride films and oxide films may be formed on the substrate, and the nitride films may be selectively etched relative to the oxide films in the first etching operation S20. Meanwhile, the first etching operation S20 may be performed to etch a thin film other than the nitride film, and in this case, the chemical solution may be selected depending on the thin film.

In some exemplary embodiments, the substrate S may be heated to a predetermined temperature in the first etching operation S20. For example, in order to increase the etch rate, the substrate S may be rapidly heated and maintained at a predetermined temperature in the first etching operation S20. In some exemplary embodiments, rapid heating of the substrate S may include laser radiation or infrared radiation. For example, rapid heating of the substrate S may be performed through irradiation with laser from below the substrate S.

In the first rinsing operation S30, the chemical solution may be supplied onto the substrate S to rinse the first puddle of the chemical solution on the substrate S. For example, the chemical solution may be supplied onto the substrate S so that the chemical solution is applied to the substrate S newly while rinsing off the first puddle of the chemical solution on the substrate S. Accordingly, the existing chemical solution remaining on the substrate S after the reaction may be removed and be replaced with a new layer of the chemical solution. Thus, in the first rinsing operation S30 may simultaneously remove the existing chemical solution and supply a new layer of the chemical solution.

For example, in the first rinsing operation S30, the substrate S may be rotated at a high speed greater than or equal to a predetermined speed for the replacement of the chemical solution. Accordingly, as the chemical solution is dispensed and supplied and centrifugal force by high-speed rotation of the substrate S is applied, the existing chemical solution on the substrate S may be pushed out of the substrate S and replaced with the new chemical solution. In the first rinsing operation S30, the new chemical solution may remain on the substrate S as the chemical solution has a certain degree of viscosity.

For the replacement of the chemical solution, the rotation speed of the substrate S in the first rinsing operation S30 may be greater than the rotation speed of the substrate S in the first puddling operation S10. For example, the rotation speed of the substrate S in the first rinsing operation S30 may be twice or more than the rotation speed of the substrate S in the first puddling operation S10. In addition, the rotation speed of the substrate S in the first rinsing operation S30 may be greater than the rotation speed of the substrate S in the first etching operation S20. For example, the rotation speed of the substrate S in the first rinsing operation S30 may be ten times or more than the rotation speed of the substrate S in the first etching operation S20.

In the second puddling operation S40, a second puddle of the chemical solution may be formed on the substrate S. For example, the chemical solution may be supplied and spread on the substrate S to form the second puddle of the chemical solution. In the second puddling operation S40, the chemical solution may be uniformly spread on the substrate S and may not overflow out of the edge of the substrate S due to its surface tension with the substrate S. For example, the substrate S may be rotated while dispensing the chemical solution onto the substrate S so that the chemical solution is spread on the substrate S and the second puddle of the chemical solution is formed. The second puddling operation S40 may be somewhat different from the first puddling operation S10 in that it is performed after the first rinsing operation S30. Because a predetermined amount of chemical solution is applied onto the substrate S in the first rinsing operation S30, the supply of the chemical solution and the formation of the puddle in the second puddling operation S40 may be performed to an extent that replenishes the chemical solution applied in the first rinsing operation S30. Therefore, the total process time of the second puddling operation S40 may be shorter than the total process time of the first puddling operation S10. Further, since the second puddling operation S40 is performed in a state where the chemical solution is already applied, the rotation speed of the substrate S in the second puddling operation S40 may be less than the rotation speed of the substrate S in the first puddling operation S10.

In the second etching operation S50, the thin film may be partially etched using the chemical solution on the substrate S. For example, in operation S50, the chemical solution may react with the thin film, thereby etching the thin film. In some exemplary embodiment, in operation S50, the etching may be performed while the substrate S is rotated at low speed to prevent the chemical liquid from escaping from the substrate S. An etch rate may decrease over time since the chemical solution forming the puddle on the substrate S is supplied in a limited quantity. Therefore, the second etching operation S50 may be performed for a predetermined period of time.

In some exemplary embodiments, the second etching operation S50 may be substantially the same as the first etching operation S20. For example, the thin film may include a nitride film, and the chemical solution may include a phosphoric acid aqueous solution, for example, a $H_3PO_4$ aqueous solution, for etching the nitride film. Meanwhile, the second etching operation S50 may be performed to etch a thin film other than the nitride film, and in this case, the chemical solution may be selected depending on the thin film. In some exemplary embodiments, the substrate S may be heated to a predetermined temperature in the second etching operation S50. For example, in order to increase the etch rate, the substrate S may be rapidly heated and maintained at a predetermined temperature in the second etching operation S50. The rapid heating of the substrate S may refer to the description of the first etching operation S20.

In the first rinsing operation S30, the chemical solution may be supplied onto the substrate S to rinse the chemical solution on the substrate S. For example, the chemical solution may be supplied onto the substrate S so that a new layer of the chemical solution is applied to the substrate S while rinsing off the chemical solution remained on the substrate S. Accordingly, the existing chemical solution remaining on the substrate S after the reaction may be removed and be replaced with the new chemical solution. In some exemplary embodiments, the second rinsing operation S60 may be substantially the same as the first rinsing operation S30.

For example, in the second rinsing operation S60, the substrate S may be rotated at a high speed greater than or equal to a predetermined speed for the replacement of the chemical solution. Accordingly, as the chemical solution is dispensed and supplied and centrifugal force by high-speed rotation of the substrate S is applied, the existing chemical solution on the substrate S may be pushed out of the substrate S and replaced with the new chemical solution. In the second rinsing operation S60, the new chemical solution may remain on the substrate S as the chemical solution has a certain degree of viscosity.

For the replacement of the chemical solution, the rotation speed of the substrate S in the second rinsing operation S60 may be greater than the rotation speed of the substrate S in the second puddling operation S40. For example, the rotation speed of the substrate S in the second rinsing operation S60 may be twice or more than the rotation speed of the substrate S in the second puddling operation S40. In addition, the rotation speed of the substrate S in the second rinsing operation S60 may be greater than the rotation speed of the substrate S in the second etching operation S50. For example, the rotation speed of the substrate S in the second rinsing operation S60 may be ten times or more than the rotation speed of the substrate S in the second etching operation S50.

As described above, the rotation speed of the substrate S in the first rinsing operation S30 and the second rinsing operation S60 may be greater than the rotation speed of the substrate S in the first puddling operation S10 and the second puddling operation S40. Also, the rotation speed of the substrate S in the first rinsing operation S30 and the second rinsing operation S60 may be greater than the rotation speed of the substrate S in the first etching operation S20 and the second etching operation S50. This is because while the first rinsing operation S30 and the second rinsing operation S60 require high speed to rinse off the existing chemical solution on the substrate S, the first puddling operation S10, the second puddling operation S40, the first etching operation S20, and the second etching operation S50 require low speed to prevent the chemical solution from escaping from the substrate S.

As shown in FIG. 2, in some exemplary embodiments, the first puddling operation S10 may include a first wetting operation S12, a first puddle forming operation S14, and a first liquid layer stabilizing operation S16.

More specifically, in the first wetting operation S12, the substrate S may be rotated while dispensing the chemical solution onto the substrate S. Accordingly, a predetermined amount of chemical solution may be dispensed and spread on the substrate S.

In the first puddle forming operation S14, a first puddle of chemical solution may be formed. For example, in operation S14, the dispensing of the chemical solution may be stopped and the substrate S is rotated to form the first puddle of chemical solution on the substrate S.

In the first liquid layer stabilizing operation S16, a thickness of a liquid layer of the chemical solution on the substrate S may be stabilized. For example, in operation S16, the rotation speed of the substrate S may be reduced and maintained to stabilize the thickness of the liquid layer, which allows the subsequent etching operation to be performed stably. Therefore, the rotation speed of the substrate S in the first liquid layer stabilizing operation S16 may be less than the rotation speed of the substrate S in the first wetting operation S12 and the first puddle forming operation S14.

As shown in FIG. 3, in some exemplary embodiments, the second puddling operation S40 may include a second puddle forming operation S44 and a second liquid layer stabilizing operation S46.

More specifically, in the second puddle forming operation S44, the substrate S may be rotated while further dispensing the chemical solution onto the substrate S so that the chemical solution may be wet to form the second puddle on the substrate S. The second puddle forming operation S44 may be distinguished from the first puddling operation S14 described above in that it includes both wetting of the chemical solution and the formation of the puddle. Because a predetermined amount of chemical solution is applied onto the substrate S in the first rinsing operation S30 before the second puddle forming operation S44, wetting and the formation of the second puddle may be simultaneously carried out without a separate wetting operation in the second puddle forming operation S44.

In this respect, the rotation speed of the substrate S in the second puddle forming operation S44 of the second puddling operation S40 may be less than the rotation speed of the substrate S in the first wetting operation S12 and the first puddle forming operation S14 of the first puddling operation S10. That is, the first wetting operation S12 and the first puddling forming operation S14 require a relatively high speed since the chemical solution is applied onto the substrate S for the first time in these operations, but in the second puddle forming operation S44 after the first rinsing operation S30, wetting and the formation of a puddle may be performed at a relatively low speed.

In some exemplary embodiments, in the second puddle forming operation S44, the dispensing of the chemical solution may be stopped after performing wetting of the chemical solution and the formation of a puddle for a predetermined period of time and the substrate S may be rotated to additionally perform a puddle forming operation.

In the second liquid layer stabilizing operation S46, a thickness of a liquid layer of the chemical solution on the substrate S may be stabilized. For example, in operation S46, the rotation speed of the substrate S may be reduced and maintained to stabilize the thickness of the liquid layer. In some exemplary embodiments, the second liquid layer stabilizing operation S46 may be substantially the same as the first liquid layer stabilizing operation S16.

In some exemplary embodiments, the rotation speed of the substrate S may be the same in the second puddling operation S40, the second etching operation S50, and the second rinsing operation S60. In some exemplary embodiments, the rotation speed of the substrate S may be similar, but with some differences, in the second puddling operation S40, the second etching operation S50, and the second rinsing operation S60.

In some exemplary embodiments, the second puddling operation S40, the second etching operation S50, and the second rinsing operation S60 may be repeated a plurality of times in this order. Accordingly, partial etching of the thin film may be repeated so that the thin film may be etched to a predetermined thickness, or entirely.

For example, the second puddling operation s40, the second etching operation S50, and the second rinsing operation S60 may form one cycle, and this cycle may be repeated a plurality of times. In another example, the second puddling operation S40 and the second etching operation S50 may form one cycle and this cycle may be repeated a plurality of times, and the second rinsing operation S50 may be added as a bridge operation between each cycle.

According to the method of etching a thin film according to the exemplary embodiments of the present invention described above, a deionized water (DI water) rinsing and drying operations may be omitted after the first etching operation S20 and the second etching operation S50, and the first and second rinsing operations S30 and S60 using the chemical solution may be performed. Therefore, according to the method of etching a thin film according to the exemplary embodiments of the present invention, a drying operation may be omitted and thus the process operations may be simplified. Further, since the chemical solution is replaced and applied onto the substrate S in the first rinsing operation S30 and the second rinsing operation S60, time taken to supply the chemical solution may be reduced in the subsequent second puddling operation S40 and the following puddling operation. Therefore, according to the method of etching a thin film according to the exemplary embodiments of the present invention, the total process time may be greatly reduced.

Figure 4:
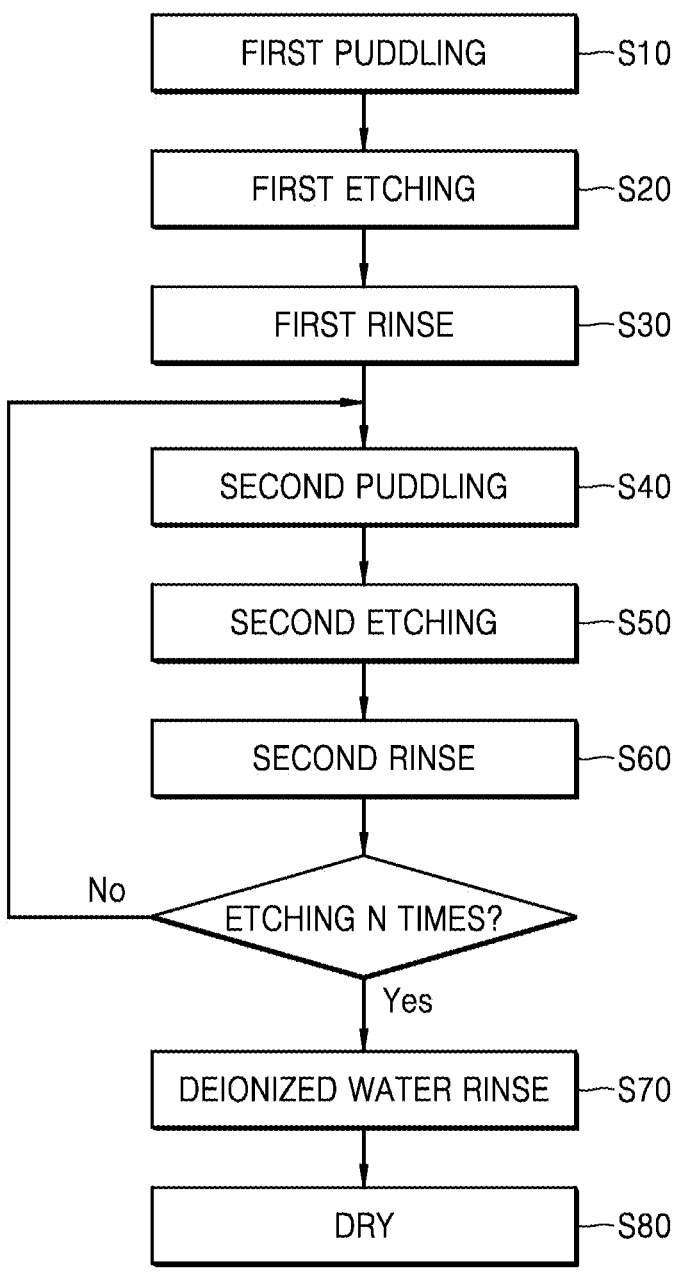
FIG. 4 is a schematic flowchart illustrating a method of etching a thin film according to another exemplary embodiment of the present invention.

FIG. 4 is a schematic flowchart illustrating a method of etching a thin film according to another exemplary embodiment of the present invention. In the method of etching a thin film according to this exemplary embodiment, some operations are added to the method of etching a thin film shown in FIGS. 1 to 3, and thus the method of FIG. 4 and the method of FIGS. 1 to 3 may be referred to each other, and redundant descriptions in the embodiments are omitted.

Referring to FIG. 4, according to the method of etching a thin film in accordance with this exemplary embodiment, after a first puddling operation S10, a first etching operation S20, a first rinsing operation S30, a second puddling operation S40, a second etching operation S50, and a second rinsing operation S60, the second puddling operation S40, the second etching operation S50, and the second rinsing operation S60 may be repeated a plurality of times, for example, N times. As a result, a thin film on a substrate S may be etched to a target thickness. For example, in the method of etching a thin film according to this exemplary embodiment, the thin film may be stripped, and may be etched repeatedly N times so that the thin film is entirely etched.

In some exemplary embodiments, the second rinsing operation S60 used as a bridge process may be omitted during the etching operation in the last cycle, that is, the Nth etching operation because subsequent etching operations are no longer performed.

Optionally, when the Nth etching operation is finished, it is necessary to remove the chemical solution remaining on the substrate S and clean the substrate S. For example, a deionized water rinsing operation S70 and a drying operation S80 may be performed once after the last etching operation.

More specifically, in the deionized water rinsing operation S70, the substrate S may be rotated at a high speed while supplying deionized water onto the substrate S, thereby removing the chemical solution and by-products remaining on the substrate S. Thereafter, the drying operation S80 may be performed by spraying an inert gas such as Ar gas or $N_2$ gas onto the substrate s at high pressure or by spraying isopropyl alcohol (IPA) onto the substrate S. Furthermore, deionized water, isopropyl alcohol (IPA), or residues on the substrate S may be removed by rotating the substrate S at high speed.

Figure 5:
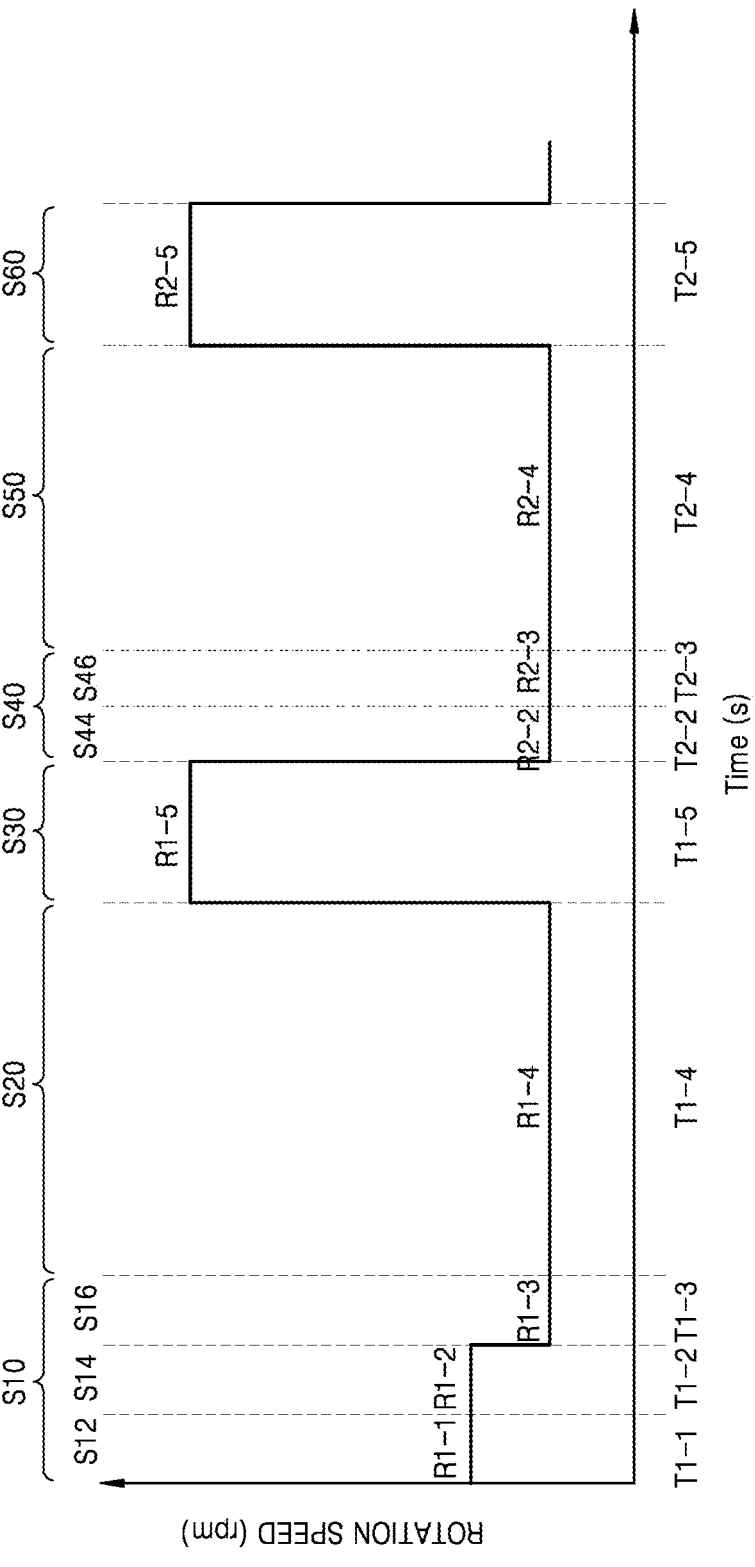
FIG. 5 is a graph illustrating a rotational speed of a substrate in each process operation in a method of etching a thin film according to exemplary embodiments of the present invention.

FIG. 5 is a graph illustrating a rotational speed of a substrate in each process operation in a method of etching a thin film according to exemplary embodiments of the present invention.

Referring to FIG. 5, in a first wetting operation S12 constituting a first puddling operation S10, the substrate S may be rotated at a 1-1 rotational speed R1-1 for a 1-1 time T1-1. In a first puddling forming operation S14, the substrate S may be rotated at a 1-2 rotational speed R1-2 for a 1-2 time T1-2, and in a first liquid layer stabilizing operation S16, the substrate S may be rotated at a 1-3 rotational speed R1-3 for a 1-3 time T1-3. In a first etching operation S20, the substrate S may be rotated at a 1-4 rotational speed R1-4 for a 1-4 time T1-4. In a first rinsing operation S30, the substrate S may be rotated at a 1-5 rotational speed R1-5 for a 1-5 time T1-5.

More specifically, the 1-1 rotational speed R1-1 and the 1-2 rotational speed R1-2 may be greater than the 1-3 rotational speed R1-3 and the 1-4 rotational speed R1-4. Further, the 1-5 rotational speed R1-5 may be greater than the 1-1 rotational speed R1-1, the 1-2 rotational speed R1-2, the 1-3 rotational speed R1-3, and the 1-4 rotational speed R1-4.

In some exemplary embodiments, the 1-1 rotational speed R1-1 and the 1-2 rotational speed R1-2 may be the same as each other, and the 1-3 rotational speed R1-3 and the 1-4 rotational speed R1-4 may be the same as each other. In some other exemplary embodiments, the 1-1 rotational speed R1-1 and the 1-2 rotation speed R1-2 may be somewhat different but similar to each other, and the 1-3 rotational speed R1-3 and the 1-4 rotational speed R1-4 may be somewhat different but similar to each other.

In a second puddle forming operation S44 constituting the second puddling operation S40, the substrate S may be rotated at a 2-2 rotational speed R2-2 for a 2-2 time T2-2, and in a second liquid layer stabilizing operation S46, the substrate S may be rotated at a 2-3 rotational speed R2-3 for a 2-3 time T2-3. In a second etching operation S50, the substrate S may be rotated at a 2-4 rotational speed R2-4 for a 2-4 time T2-4. In a second rinsing operation S60, the substrate S may be rotated at a 2-5 rotational speed R2-5 for a 2-5 time T2-5. More specifically, the 2-5 rotational speed R2-5 may be greater than the 2-2 rotational speed R2-2, the 2-3 rotational speed R2-3 and the 2-4 rotational speed R2-4. In some exemplary embodiments, the 2-2 rotational speed R2-2, the 2-3 rotation speed R2-3 and the 2-4 rotational speed R2-4 may be somewhat different but similar to each other.

FIG. 6 is a table illustrating details of each process operation in a method of etching a thin film according to exemplary embodiments of the present invention. For example, FIG. 6 illustrates thin film etching conditions for a case where a thin film includes a nitride film and a phosphoric acid ($H_3PO_4$) aqueous solution is used to remove the nitride film.

Referring to FIG. 6, the rotation speed of the substrate S in the first rinsing operation S30 and the second rinsing operation S60 is 100 rmp or more, which is significantly greater than the is rotation speed of the substrate S in the first puddling operation S10 and the second puddling operation S40. Also, it can be seen that the rotation speed of the substrate S in the first rinsing operation S30 and the second rinsing operation S60 is significantly greater than the rotation speed of the substrate S in the first etching operation S20 and the second etching operation S50.

Moreover, it can be seen that the total process time of the first puddling operation is longer than the total process time of the second puddling operation S40. This is because, as described above, the first wetting operation S12 and the first puddle forming operation S14 of the first puddling operation S10 for the initial wetting and formation of a puddle is performed for a relatively longer duration than the second wetting operation and puddle forming operation S44 of the second puddling operation S40. However, since such conditions are conditions for a particular device and a particular thin film, the overall tendency is generally applied, but detailed conditions may vary when the device and the thin film are changed.

Figure 8:
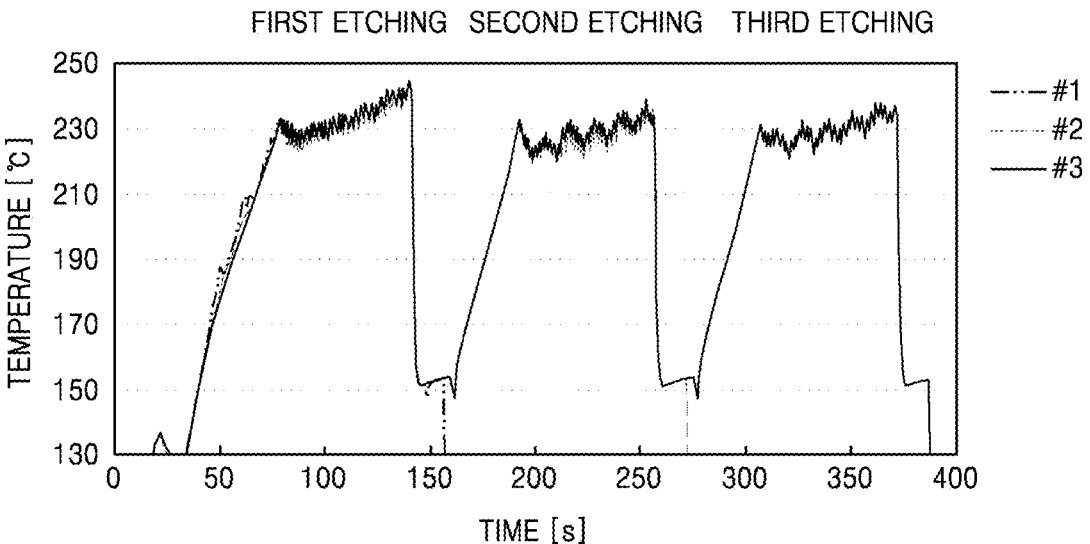
FIG. 8 is a graph showing the change in temperature with time of a substrate in the experimental example of FIG. 7.

FIG. 7 is a table illustrating results of etching a thin film according an experimental example of the present invention, and FIG. 8 is a graph showing the change in temperature with time of a substrate in the experimental example of FIG. 7. FIG. 7 may show the result of an experiment performed under the conditions shown in FIG. 6.

Referring to FIG. 8, during the first to third cycles of etching a thin film, the thin film is etched by a thickness of 273 to 399 Å in each cycle. It can be seen that an etched thickness is somewhat high in the first cycle but etching is carried out with a deviation of 10% or less in the second and third cycles.

Referring to FIG. 8, it can be seen that the temperature during the first etching operation in the first cycle is maintained higher than the temperature during the second etching operation in the second cycle and the temperature during the third etching operation in the third cycle. Therefore, it is construed that a high etched amount during the first cycle is caused by the temperature deviation of the substrate S in the etching operation. This experimental results are the results of a preliminary experiment before the optimization, and the temperature deviation may be reduced by tuning the process conditions.

Therefore, the results in the experimental example show that etching of the thin film can be stably performed even when the conventional deionized water rinsing and drying operations are changed to a chemical solution rinsing operation.

FIG. 9 is a schematic cross-sectional view showing a substrate processing apparatus 100 for etching a thin film according to exemplary embodiments of the present invention.

Referring to FIG. 9, a substrate processing apparatus 100 may include a processing container 110, a chemical solution dispensing unit 120, a substrate support unit 130, and a control unit 150.

More specifically, the processing container 110 may have an inner space. The substrate support unit 130 may be installed in the inner space and a chemical solution may be processed. The structure of the processing container 110 may be modified in various ways, and does not limit the scope of this embodiment.

The substrate support unit 130 may be installed in the processing container 110 to support and rotate a substrate S on which a thin film is formed. For example, the substrate support unit 130 may include a seat 132 and a shaft 134. In the seat 132, the substrate S may be seated on lift pins 133. The shaft 134 may be coupled to a lower surface of the seat 132 to support the seat 132, and may rotate to rotate the substrate S and the seat 132. For example, a drive motor 138 may be coupled to a lower portion of the shaft 134, rotating the shaft 134.

In some exemplary embodiments, the shaft 134 may have a hollow structure, and a laser emitting unit 138 may be at least in part disposed in the shaft 134, for example, in a hollow space. For example, the laser emitting unit 138 may rapidly heat the substrate S through irradiation with laser from below the substrate S. The seat 132 may be formed of a light-transmitting material, such as quartz, so that the laser emitted from the laser emitting unit 138 passes through the seat 132. Meanwhile, in a modified example of this embodiment, the laser emitting unit 138 may be changed to another light emitting unit, for example, an infrared (IR) emitting unit, or the like.

A chemical solution dispensing unit 120 may be disposed on the substrate support unit 130 to dispense a chemical solution onto the substrate S. For example, the chemical solution dispensing unit 120 may be provided in the form of a nozzle. Meanwhile, the chemical solution dispensing unit 102 may be connected to a chemical solution supply unit (not shown) and supplied with a chemical solution from the chemical liquid supply unit.

Optionally, a recovery bowl 142 for recovering the chemical solution may be installed in the processing container 110. For example, the recovery bowl 142 may be disposed in the vicinity of the substrate support unit 130 and may be disposed in the vicinity of the substrate S to recover the chemical solution escaping from the substrate S. Furthermore, the recovery bowl 142 may be moved up and down by the drive motor 145 to adjust its height.

The control unit 150 may control the operation of the substrate processing apparatus 100. For example, the control unit 150 may control the dispensing of the chemical solution by the chemical solution dispensing unit 120, the rotation of the substrate support unit 130, and/or the height of the recovery bowl 142. More specifically, the control unit 150 may send a control signal to the chemical solution dispensing unit 120 to control the dispensing of the chemical solution, control the drive motor 136 to control the rotation of the substrate support unit 130, and control the drive motor 145 to control the height of the recovery bowl 142. Furthermore, the control unit 150 may further control the driving of the laser emitting unit 138.

The thin film etching process described above with reference to FIGS. 1 to 4 may be performed using the substrate processing apparatus 100. A method of etching a thin film on the substrate S by using the substrate processing apparatus 100 may refer to the above description.

For example, in order to etch a thin film on the substrate S, the control unit 150 may control the substrate support unit 130 and the chemical solution dispensing unit 120 to repeatedly perform the puddling operations S10 and S40 of forming a puddle of the chemical solution by supplying the chemical solution onto the substrate S, the etching operations S20 and S50 of partially etching the thin film using the chemical solution on the substrate S, and the rinsing operations S30 and S60 of supplying the chemical solution onto the substrate S to apply the new chemical solution onto the substrate S while rinsing off the puddle of the chemical solution on the substrate S are repeated twice or more in this order.

In some exemplary embodiments, the control unit 150 may control the rotation of the substrate support unit 130 such that the rotation speed of the substrate S in the rinsing operation such as in the first rinsing operation S30 and the second rinsing operation S60 is greater than the rotation speed of the substrate S in the puddling operation such as in the first puddling operation S10 and the second puddling operation S40. Furthermore, the control unit 150 may control the rotation of the substrate support unit 130 such that the rotation speed of the substrate S in the rising operation such as in the first rinsing operation S30 and the second rinsing operation S60 is greater than the rotation speed of the substrate S in the etching operation such as in the first etching operation S20 and the second etching operation S50.

Optionally, the control unit 150 may control the temperature of the substrate S such that the substrate S is rapidly headed and maintained at a predetermined temperature in the etching operations S20 and S50. For example, the control unit 150 may control the laser emitting unit 136 to emit light from below the substrate S for rapid heating of the substrate S in the etching operations S20 and S50.

Therefore, when using the substrate processing apparatus 100, the rinsing operations S30 and S60 using a chemical solution are adopted after the etching operations S20 and S50 in the thin film etching method that repeats cycles, so that the entire process time can be greatly reduced and the productivity can be significantly improved.

The substrate processing apparatus 100 described above is an exemplary structure for implementing the method of etching a thin film shown in FIGS. 1 to 4, and may be modified or replaced with other structures.

According to the method of etching a thin film and the substrate processing apparatus according to some exemplary embodiments described above, the process time may be reduced and the efficiency of production may be improved. However, the scope of the present disclosure is not limited by the above effect.

While the present invention has been particularly shown and described with reference to embodiments thereof, it will be understood by those of ordinary skill in the art that various changes in form and details may be made therein without departing from the spirit and scope of the present invention as defined by the following claims.

REFERENCE NUMERALS

100: SUBSTRATE PROCESSING APPARATUS
110: PROCESSING CONTAINER
120: CHEMICAL SOLUTION DISPENSING UNIT
130: SUBSTRATE SUPPORT UNIT
150: CONTROL UNIT

What is claimed is:

1. A method of etching a thin film, comprising:
a first puddling operation of forming a first puddle of a chemical solution on a substrate by supplying and spreading the chemical solution on the substrate on which a thin film is formed;
a first etching operation of partially etching the thin film using the chemical solution on the substrate;
a first rinsing operation of supplying the chemical solution onto the substrate to rinse off the first puddle of the chemical solution on the substrate and apply the chemical solution onto the substrate;
a second puddling operation of forming a second puddle of the chemical solution on the substrate by supplying and spreading the chemical solution on the substrate;
a second etching operation of partially etching the thin film using the chemical solution on the substrate; and
a second rinsing operation of supplying the chemical solution onto the substrate to rinse off the second puddle of the chemical solution on the substrate and apply the chemical solution onto the substrate,
wherein the substrate is heated and maintained at a predetermined temperature, by irradiation with laser from below the substrate, in the first etching operation and the second etching operation.

2. The method of claim 1, wherein a rotation speed of the substrate in the first rinsing operation and the second rinsing operation is greater than a rotation speed of the substrate in the first puddling operation and the second puddling operation.

3. The method of claim 1, wherein a rotation speed of the substrate in the first rinsing operation and the second rinsing operation is greater than a rotation speed of the substrate in the first etching operation and the second etching operation.

4. The method of claim 1, wherein the first puddling operation comprises:
a first wetting operation of rotating the substrate while dispensing the chemical solution onto the substrate;
a first puddle forming operation of stopping the dispensing of the chemical solution and forming the first puddle of the chemical solution while rotating the substrate; and
a first liquid layer stabilizing operation of stabilizing a thickness of a liquid layer of the chemical solution on the substrate.

5. The method of claim 4, wherein a rotation speed of the substrate in the first liquid layer stabilizing operation is less than a rotation speed of the substrate in the first wetting operation and the first puddling forming operation.

6. The method of claim 4, wherein the second puddling operation comprises:

a second puddle forming operation of wetting the chemical solution and forming the second puddle of the chemical solution by rotating the substrate while further dispensing the chemical solution onto the substrate; and a second liquid layer stabilizing operation of stabilizing a thickness of the liquid layer of the chemical solution on the substrate.

7. The method of claim 6, wherein a rotation speed of the substrate in the second puddling forming operation is less than a rotation speed of the substrate in the first wetting operation and the first puddling forming operation.

8. The method of claim 6, wherein a rotation speed of the substrate is the same in the second puddle forming operation, the second liquid layer stabilizing operation, and the second etching operation.

9. The method of claim 1, wherein a total process time of the second puddling operation is shorter than a total process time of the first puddling operation.

10. The method of claim 1, wherein the laser irradiation is controlled to maintain the predetermined temperature during the first etching operation and the second etching operation.

11. The method of claim 1, wherein the second puddling operation, the second etching operation, and the second rinsing operation are repeatedly performed a plurality of times.

12. The method of claim 1, wherein the thin film comprises a nitride film and the chemical solution comprises a phosphoric acid aqueous solution.

13. A method of etching a thin film, comprising:

a first puddling operation of forming a first puddle of a chemical solution on a substrate by supplying and spreading the chemical solution on the substrate on which a thin film is formed;

a first etching operation of partially etching the thin film using the chemical solution on the substrate;

a first rinsing operation of supplying the chemical solution onto the substrate to rinse off the first puddle of the chemical solution on the substrate and apply the chemical solution onto the substrate;

a second puddling operation of forming a second puddle of the chemical solution on the substrate by supplying and spreading the chemical solution on the substrate;

a second etching operation of partially etching the thin film using the chemical solution on the substrate; and a second rinsing operation of supplying the chemical solution onto the substrate to rinse off the second puddle of the chemical solution on the substrate and apply the chemical solution onto the substrate, wherein:

the first puddling operation comprises:

a first wetting operation of rotating the substrate while dispensing the chemical solution onto the substrate;

a first puddle forming operation of stopping the dispensing of the chemical solution and forming the first puddle of the chemical solution while rotating the substrate; and a first liquid layer stabilizing operation of stabilizing a thickness of an liquid layer of the chemical solution on the substrate, the second puddling operation comprises:

a second puddle forming operation of wetting the chemical solution and forming the second puddle of the chemical solution by rotating the substrate while further dispensing the chemical solution onto the substrate; and a second liquid layer stabilizing operation of stabilizing a thickness of an liquid layer of the chemical solution on the substrate, and wherein a rotation speed of the substrate in the first rinsing operation and the second rinsing operation is greater than a rotation speed of the substrate in the first puddling operation and the second puddling operation, and wherein the substrate is heated and maintained at a predetermined temperature, by irradiation with laser from below the substrate, in the first etching operation and the second etching operation.

\* \* \* \* \*